United States Patent [19]

Ishino et al.

[11] Patent Number: 5,960,257
[45] Date of Patent: Sep. 28, 1999

[54] METHOD DISTRIBUTED FEEDBACK SEMICONDUCTOR LASER FOR FABRICATING

[75] Inventors: Masato Ishino, Shijyonawate; Masahiro Kitoh, Toyonaka; Nobuyuki Otsuka, Kawanishi; Yasushi Matsui, Neyagawa, all of Japan

[73] Assignee: Matsushita Electric Industrial Co., Ltd., Osaka, Japan

[21] Appl. No.: 08/933,707

[22] Filed: Sep. 19, 1997

Related U.S. Application Data

[62] Division of application No. 08/606,455, Feb. 23, 1996, Pat. No. 5,764,682, which is a division of application No. 08/293,987, Aug. 18, 1994, Pat. No. 5,539,766.

[30] Foreign Application Priority Data

Aug. 19, 1993 [JP] Japan ................................. 5-205020

[51] Int. Cl.[6] .................................................. H01L 21/00
[52] U.S. Cl. .................................. 438/31; 438/32; 438/42; 372/96; 372/102; 148/DIG. 95
[58] Field of Search ................................. 438/31, 32, 42; 372/96, 102; 148/DIG. 95

[56] References Cited

U.S. PATENT DOCUMENTS

| | | | |
|---|---|---|---|
| 4,573,158 | 2/1986 | Utaka et al. | 372/32 |
| 4,622,114 | 11/1986 | Glass et al. | 204/129.3 |
| 4,704,720 | 11/1987 | Yamaguchi | 372/96 |
| 4,786,951 | 11/1988 | Tokuda et al. | 357/17 |
| 5,093,835 | 3/1992 | Takemoto et al. | |

(List continued on next page.)

FOREIGN PATENT DOCUMENTS

| | | |
|---|---|---|
| 4014233 | 11/1991 | Germany . |
| 4124872 | 1/1993 | Germany . |
| 62-84583 | 4/1987 | Japan . |
| 4-155986 | 5/1992 | Japan . |
| 4-326788 | 11/1992 | Japan . |
| 6-85402 | 3/1994 | Japan . |

OTHER PUBLICATIONS

Y. Luo et al., "Purely Gain–Coupled Distributed Feedback Semiconductor Lasers", *Appl. Phys. Lett.* 56(17), pp. 1620–1622 (Apr. 1990).

T. Makino et al., "High Performance 1.55 μm Strained–Layer MQW Gain–coupled DFB Lasers", *Optoelectronics Conference Digest.* pp. 402–403 (Jul. 1994).

K. Kudo et al., "New method to Reduce Effective Linewidth Enhancement Factor $\alpha_{eff}$ of DSM Lasers using Optical Complex Coupling", *13th IEEE International Semiconductor Laser Conference.* pp. 16–17 (1992).

(List continued on next page.)

*Primary Examiner*—Peter Toby Brown
*Assistant Examiner*—Long Pham
*Attorney, Agent, or Firm*—Ratner & Prestia

[57] ABSTRACT

A distributed feedback semiconductor laser which includes a semiconductor substrate of a first conductive type; a semiconductor multi-layer structure provided on the semiconductor substrate and including an active layer for generating laser light; and a gain-coupled diffraction grating provided between the semiconductor substrate and the semiconductor multi-layer structure. The diffraction grating includes a plurality of curved projections periodically arranged at a surface of the semiconductor substrate and a quantum well light absorption layer for covering the plurality of curved projections. The quantum well light absorption layer includes a light absorption area having a first thickness at each border between two adjacent curved projections and a non-light absorption area having a second thickness which is smaller than the first thickness at a top of each of the curved projections. The light absorption area has a band gap which is narrower than a band gap of the active layer, and the non-light absorption area has a band gap which is wider than the band gap of the active layer.

9 Claims, 12 Drawing Sheets

U.S. PATENT DOCUMENTS

| | | |
|---|---|---|
| 5,143,864 | 9/1992 | Takemoto et al. . |
| 5,208,824 | 5/1993 | Tsang . |
| 5,276,702 | 1/1994 | Meliga . |
| 5,289,494 | 2/1994 | Tada et al. . |
| 5,292,685 | 3/1994 | Inoguchi et al. .......................... 437/107 |
| 5,452,318 | 9/1995 | Makino et al. . |
| 5,528,413 | 6/1996 | Ishimura ................................. 359/248 |
| 5,539,766 | 7/1996 | Ishino et al. ............................... 372/96 |
| 5,581,570 | 12/1996 | Yoshida et al. ............................ 372/46 |
| 5,764,682 | 6/1998 | Ishino et al. ............................... 372/96 |

OTHER PUBLICATIONS

W.T. Tsang, et al., "Semiconductor Distributed Feedback Lasers with Quantum Well or Superlattice Gratings for Index or Gain–Coupled Optical Feedback", *Appl. Phys. Letters.* vol. 60, No. 21, pp. 2580–2582 (May 1992).

Long–Wavelength InGaAsP/InP Distributed Feedback Lasers Incororating Gain–Coupled Mechanism, *IEEE Phontonics Technology Letters,* vol. 4, No. 3, pp. 212–215 (Mar. 1992).

B. Borchert et al., "Fabrication and Characteristics of Improved Strained Quantum–Well GaInAlAs Gain–Coupled DFB Lasers", *Electronics Letters,* vol. 29, No. 2, pp. 210–211 (Jan. 1993).

German Search Report dated Oct. 26, 1995 w/translation.

D. H. Jang et al., "InAsP Phase Formation During the Growth of GalnAsP/InP Distributed Feeback Lasr Diode Structure on Corrugated InP using Metalorganic Vapor Phase Epitaxy", *Applied Physics Letters,* 66(23), Jun. 5, 1995, pp. 3191–3193).

$Eg_2 < Eg_3 < Eg_1$ $t_1 < t_2$

METHOD DISTRIBUTED FEEDBACK SEMICONDUCTOR LASER FOR FABRICATING

This application is a division of application Ser. No. 08/606,455, filed Feb. 23, 1996, now U.S. Pat. No. 5,764,682, which is a divisional of Ser. No. 08/293,987, filed on Aug. 18, 1994, now U.S. Pat. No. 5,539,766.

BACKGROUND OF THE INVENTION

1. Field of the Invention

The present invention relates to a distributed feedback semiconductor laser (hereinafter, referred to as a "DFB laser") suitable as a light source for long distance, large capacity optical communication, and to a method for fabricating the same.

2. Description of the Related Art

Recently, DFB semiconductor lasers have been in a practical use as a light source for long distance, large capacity data transfer and for multiple channel video transfer for CATV and the like. Some of the reasons for such wide use of DFB semiconductor lasers will be described below. While usual Fabry-Pérot semiconductor lasers oscillate light in a multiple longitudinal mode, DFB lasers oscillate light in a single longitudinal mode even in high speed modulation, due to a diffraction grating formed in the vicinity of an active layer. Accordingly, the noise level is low, and signals are well protected against deterioration which otherwise would be caused by dispersion during signal transfer.

Currently, refractive index-coupled DFB lasers are primarily used, in which the diffraction grating is realized by periodically changing the thickness of an optical waveguide layer located above or below the active layer. In such a refractive index-coupled DFB laser, there are two oscillation modes: at a wavelength longer than the Bragg wavelength; and at a wavelength shorter than the Bragg wavelength. The Bragg wavelength is determined by the period of the diffraction grating and the refractive index of the cavity. Either one of the oscillation modes is used by the phase at an end face of the cavity. Accordingly, stable single longitudinal mode oscillation is obtained at approximately 30%. Even though a single longitudinal mode oscillation is obtained at a low output, the oscillation mode is changed at a high output by phase fluctuation caused by an axial hole burning effect, thereby reducing the yield for obtaining stable single longitudinal mode oscillation in a wide range from a low output to a high output. In the case when emitted light is partially returned to the laser, the oscillation state changes to raise the noise level or change the single longitudinal mode oscillation into the multiple longitudinal mode oscillation. In order to establish stable single longitudinal mode oscillation under such circumstances, the refractive index-coupled DFB laser is presented in a form of a module including a built-in optical isolator for practical use. However, the low yield and the use of the optical isolator increase production cost, thus preventing wider use of DFB lasers.

In recent years, gain-coupled DFB lasers have been a focus of attention as a DFB laser having a novel structure for solving the above-described problems of refractive index-coupled DFB lasers (See, for example, Yi Luo et al., Applied Physics Letters, vol. 56, No. 17, pp. 1620–1622, Apr. 23, 1990.). In the structure of gain-coupled DFB lasers, the Bragg wavelength is basically used as the oscillation wavelength. Accordingly, stable single longitudinal mode oscillation is obtained at a high yield with no influence of the phase fluctuation at an end face of the cavity. Gain-coupled DFB lasers are not easily influenced by the phase fluctuation caused by the axial hole burning effect, either, which also contributes to a high yield of obtaining the stable single longitudinal mode oscillation mode at a high output and stable operation against the light returned to the DFB laser. In consideration of these facts, gain-coupled DFB lasers can be expected to be a light source operable in a single oscillation mode and produced by a lower cost. Gain-coupled DFB lasers are available in primarily two structures. In one structure, a diffraction grating is formed in an active layer; and in the other structure, a diffraction grating includes an absorptive layer. The latter structure is more promising for practical use in consideration of oscillation at a low threshold level and high reliability.

Briefly referring to FIG. 1, an example of a gain-coupled DFB laser 50 having the latter structure will be described. FIG. 1 is a cross sectional view of the gain-coupled DFB laser 50. As is shown in FIG. 1, the gain-coupled DFB laser 50 includes an n-GaAs substrate 31, an n-GaAlAs first cladding layer 32, a GaAs/GaAlAs SCH-MQW active layer 33, a p-GaAlAs first barrier layer 34, a p-GaAlAs second barrier layer 35, a p-GaAlAs optical waveguide layer 36, a p-GaAlAs second cladding layer 37, and an n-GaAs absorptive diffraction grating 41. The layers 31 through 37 are epitaxially grown in this order, and the n-GaAs absorptive diffraction grating 41 is buried between the p-GaAlAs second barrier layer 35 and the p-GaAlAs optical waveguide layer 36. Due to the n-GaAs absorptive diffraction grating 41, the periodical change in the absorption coefficient causes the periodical changes in the gain, and thus gain-coupled oscillation is obtained.

Referring now to FIGS. 2 and 3, a method for fabricating the gain-coupled DFB laser 50 will be described. In FIG. 2, reference numeral 51 denotes an epitaxial substrate including the layers 32 through 35 as referred to in FIG. 1. On the epitaxial substrate 51, the n-GaAs absorptive layer 40 is formed. As is shown in FIG. 2, a resist layer 52 having a periodical pattern is formed on the n-GaAs absorptive layer 40 by an EB exposure method. Then, as is shown in FIG. 3, the epitaxial substrate 51 is etched by dry etching down to a level below the bottom of the n-GaAs absorptive layer 40 at areas which are not covered with the resist layer 52, thereby forming projections. After the resist layer 52 is removed, the GaAs absorptive diffraction grating 41 is on top of the projections. Next, the layers 36 and 37 (FIG. 1) are epitaxially grown to produce the gain-coupled DFB laser 50.

It is known that the duty ratio (the ratio of the size of the light absorption area with respect to the pitch of each period of the diffraction grating; represented by a/b in FIG. 3) is preferably approximately 0.1 to 0.2 in order to obtain satisfactory characteristics of the DFB laser 50. It is very important that the diffraction grating should be shaped uniformly for the purpose of attaining such a preferable duty ratio.

The pitch of each period of the diffraction grating is required to be approximately 0.2 μm to 0.4 μm, and the pitch of the pattern of the resist layer 52 should be as microscopic as 0.1 μm to 0.2 μm. Although it is possible to use the EB exposure method to form such a microscopic pattern uniformly, the use of the EB exposure method is not practical because of the long time required for exposure and the high cost of the apparatus. Dry etching is superior to wet etching in controllability, but damages a part of the semiconductor layer and reduces the reliability of the finished DFB laser.

It is more practical to form the resist layer 52 having the periodical pattern by holographic exposure and etch the semiconductor layer by wet etching. However, in the case that the holographic exposure and wet etching are used, the pitch of the resist pattern is dispersed as is shown in FIG. 2 as well as the etching pitch. As a result, the diffraction grating is largely dispersed in shape in the wafer and even disappears in some areas. The distribution of the absorption ratio α is also largely dispersed. For these reasons, it is difficult to control the duty ratio. Due to such problems in production, it is difficult to obtain desirable characteristics at a high yield.

In order to solve these problems, a method described in, for example, Japanese Laid-Open Patent Publication No. 4-326788, has been proposed. FIG. 4 shows a cross sectional view of an absorptive diffraction grating and the vicinity thereof of a DFB laser produced in such a method. According to this method, as is shown in FIG. 4, the absorptive diffraction grating includes a plurality of projections and grooves and a quantum well absorptive layer 56 provided on the projections and the grooves. The thickness of the quantum well absorptive layer 56 changes in accordance with the projections and the grooves in order to surely change the absorption ratio periodically. In such a structure, the partial disappearance of the absorptive layer is restricted. Nonetheless, due to the diffraction grating layer formed at a surface of an optical waveguide layer 55 on an active layer 54, the dispersion of etching depth causes the dispersion of the thickness of a trough part 56V of the absorptive layer 56 and also the dispersion of the distance between the absorptive layer 56 and the active layer 54. Consequently, it is difficult to control the gain coupling coefficient of such a DFB laser.

Further, the dispersion of the thickness of the optical waveguide layer 55 caused by etching is disadvantageous in controlling the refractive index coupling coefficient. It is important to perform additional etching after the resist is removed in order to adjust the height d of the projection formed at the optical waveguide layer 55 and also in order to form a satisfactory epitaxial layer on the absorptive layer 56. However, in the structure shown in FIG. 4, it is almost impossible to perform additional etching since such additional etching would reduce or, in an extreme case, nullify the thickness of the optical waveguide layer 55. Dry etching is desirable in forming the absorptive layer 56 in a preferable shape but can possibly damage the active layer 54.

In other gain-coupled DFB lasers, the gain of the active layer is periodically changed without using the absorptive diffraction grating. A representative structure of such DFB lasers is reported in *Optoelectronics Conference Digest*, p. 402 (1994). In such DFB lasers, a gain diffraction grating is realized by processing the active layer. Accordingly, a larger gain coupling is obtained than in the structure having an absorptive diffraction grating. Satisfactory characteristics are obtained with no extra increase in the absorption ratio. Nonetheless, growth of a p-InP cladding layer performed after the active layer is etched, a defect or accumulation of foreign substances occurs in the vicinity of the p-n junction. Such a defect or accumulation of foreign substances reduces the light emitting efficiency when the electric current is injected or shortens the life of the DFB laser.

As has been described, in conventional DFB lasers, the shape of the diffraction grating is dispersed in even one laser. In consequence, the lasers do not have satisfactory characteristics and thus are not reliable. Further, conventional DFB lasers have low production yield and thus are poor in mass production.

SUMMARY OF THE INVENTION

In one aspect of the present invention, a distributed feedback semiconductor laser includes a semiconductor substrate of a first conductive type; a semiconductor multi-layer structure provided on the semiconductor substrate and including an active layer for generating laser light; and a gain-coupled diffraction grating provided between the semiconductor substrate and the semiconductor multi-layer structure. The diffraction grating includes a plurality of curved projections periodically arranged at a surface of the semiconductor substrate and a quantum well light absorption layer for covering the plurality of curved projections. The quantum well light absorption layer includes a light absorption area having a first thickness at each border between two adjacent curved projections and a non-light absorption area having a second thickness which is smaller than the first thickness at a top of each of the curved projections. The light absorption area has a band gap which is narrower than a band gap of the active layer, and the non-light absorption area has a band gap which is wider than the band gap of the active layer.

In one embodiment of the invention, the thickness of the quantum well light absorption layer changes periodically and non-linearly along a cavity.

In one embodiment of the invention, the semiconductor multi-layer structure includes an optical waveguide layer of the first conductivity type provided between the active layer and the diffraction grating; and a cladding layer of a second conductivity type located farther from the semiconductor substrate than the active layer is located.

In one embodiment of the invention, the active layer has a quantum well structure.

In one embodiment of the invention, the active layer has a strained quantum well structure.

In another aspect of the invention, a distributed feedback semiconductor laser includes a semiconductor substrate of a first conductivity type; a semiconductor multi-layer structure provided on the semiconductor substrate and including an active layer for generating laser light; and a gain-coupled diffraction grating provided between the semiconductor substrate and the semiconductor multi-layer structure. The diffraction grating includes a first semiconductor layer provided on the semiconductor substrate; a plurality of projections periodically arranged at a surface of the first semiconductor layer; a quantum well light absorption layer for covering the plurality of projections; and a second semiconductor layer provided on the quantum well light absorption layer and having a substantially smooth top surface. The quantum well light absorption layer includes a light absorption area having a first thickness at each border between two adjacent projections and a non-light absorption area having a second thickness which is smaller than the first thickness at a top of each of the projections. The light absorption area has a band gap which is narrower than a band gap of the active layer, and the non-light absorption area has a band gap which is wider than the band gap of the active layer. The first semiconductor layer has a band gap which is narrower than the band gap of the second semiconductor layer.

In one embodiment of the invention, the projections are each curved, and the thickness of the quantum well light absorption layer changes periodically and non-linearly along a cavity.

In one embodiment of the invention, the active layer has a quantum well structure.

In one embodiment of the invention, the active layer has a strained quantum well structure.

In still another aspect of the invention, a distributed feedback semiconductor laser includes an active layer for generating laser light; and a gain-coupled diffraction grating.

The diffraction grating includes a plurality of projections and grooves periodically arranged; and a quantum well light absorption layer including a plurality of parts respectively provided in the grooves. The quantum well light absorption layer has a band gap which is narrower than a band gap of the active layer.

In one embodiment of the invention, the projections and the grooves are located at a surface of an InP layer, and the quantum well light absorption layer is formed of InAsP.

In one embodiment of the invention, each part of the quantum well light absorption layer has a size along the cavity which is no greater than 20% of one period of the diffraction grating.

In still another aspect of the invention, a method for fabricating a distributed feedback semiconductor laser includes the steps of forming a gain-coupled diffraction grating on a semiconductor substrate; and forming a semiconductor multi-layer structure including an active layer for generating laser light on the diffraction grating. The step of forming the diffraction grating includes the steps of forming a plurality of curved projections periodically arranged at a surface of the semiconductor substrate by photolithography and etching; and covering the plurality of curved projections with a quantum well light absorption layer including a light absorption area having a first thickness at each border between two adjacent curved projections and a non-light absorption area having a second thickness which is smaller than the first thickness at a top of each of the curved surfaces, the light absorption area being formed to have a band gap which is narrower than a band gap of the active layer and the non-light absorption area being formed to have a band gap which is wider than the band gap of the active layer.

In one embodiment of the invention, the step of forming the plurality of curved projections includes the steps of forming sharp-edged projections and grooves periodically arranged at the surface of the semiconductor substrate by a first etching process; and curving the sharp edges of the projections by a second etching process.

In still another aspect of the invention, a method for fabricating a distributed feedback semiconductor laser includes the steps of forming a gain-coupled diffraction grating on a semiconductor substrate; and forming a semiconductor multi-layer structure including an active layer for generating laser light on the diffraction grating. The step of forming the diffraction grating includes the steps of depositing a first semiconductor layer on the semiconductor substrate; forming a plurality of projections and grooves periodically arranged at a surface of the first semiconductor layer by photolithography and etching; covering the plurality of projections and grooves with a quantum well light absorption layer including a light absorption area having a first thickness at each of the grooves between two adjacent projections and a non-light absorption area having a second thickness which is smaller than the first thickness at a peak of each of the projections, the light absorption area being formed to have a band gap which is narrower than a band gap of the active layer and the non-light absorption area being formed to have a band gap which is wider than the band gap of the active layer; and depositing a second semiconductor layer on the quantum well light absorption layer so as to have a band gap which is wider than a band gap of the first semiconductor layer.

In still another aspect of the invention, a method for fabricating a distributed feedback semiconductor laser includes the steps of forming a gain-coupled diffraction grating on a semiconductor substrate; and forming a semiconductor multi-layer structure including an active layer for generating laser light on the diffraction grating. The step of forming the diffraction grating includes the steps of forming a plurality of projections and grooves periodically arranged by photolithography and etching; and heating the projections and grooves with a gas phase atmosphere including $AsH_3$, thereby forming a quantum well light absorption layer formed of InAsP so that a plurality of parts of the quantum well light absorption layer are respectively located in the grooves.

Thus, the invention described herein makes possible the advantages of providing a DFB laser which is improved in reliability and easier to mass-produce and having a high production yield, and a method for fabricating such a DFB laser.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
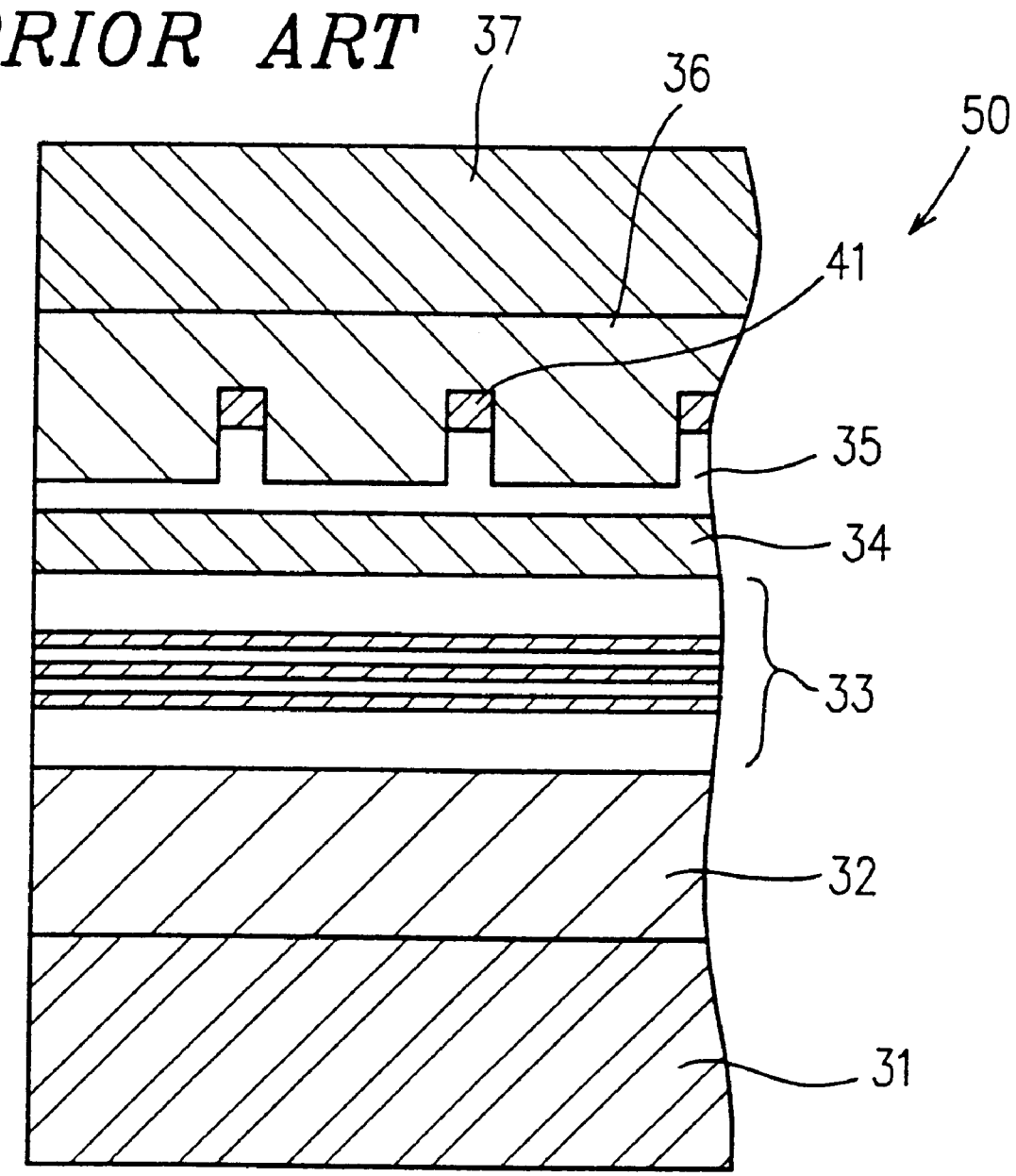
FIG. 1 is a cross sectional view of a conventional DFB laser having a gain-coupled diffraction grating.
Figure 2:
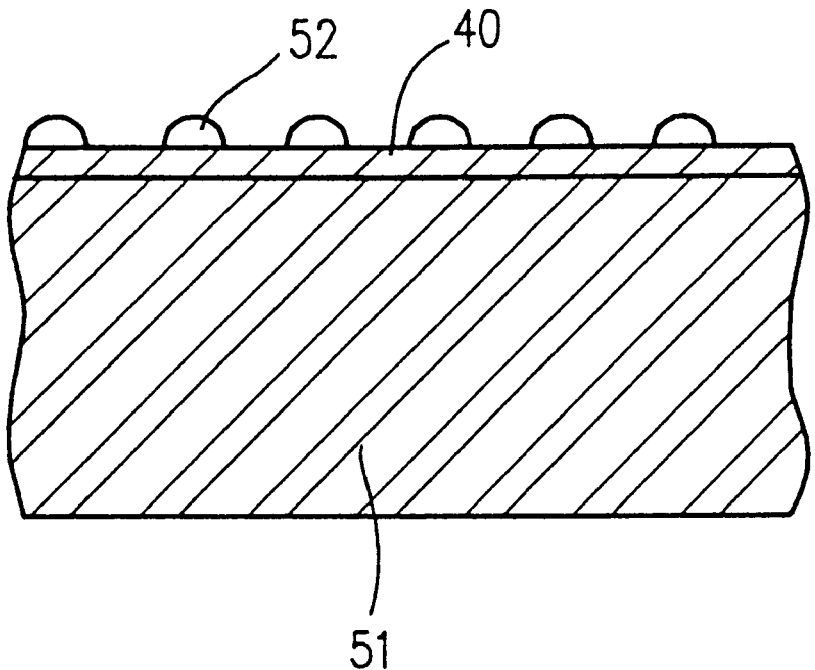
FIG. 2 is a cross sectional view of the conventional DFB laser shown in FIG. 1 illustrating a production step thereof.
Figure 3:
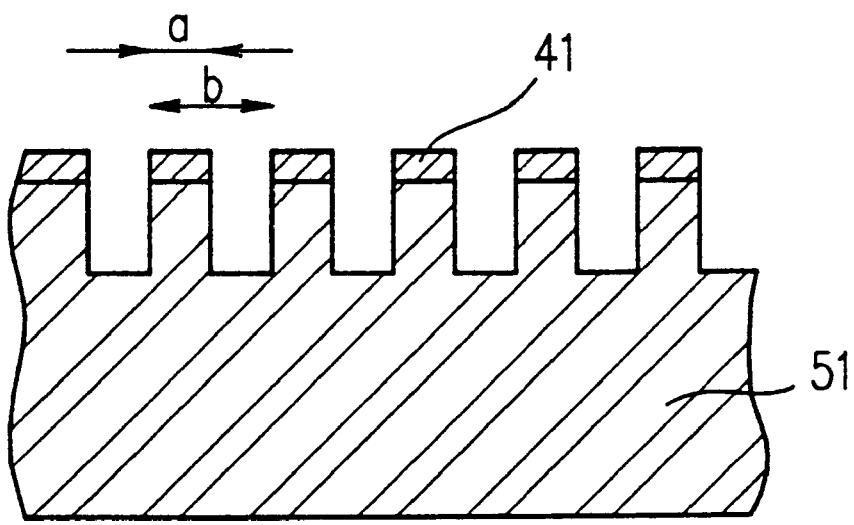
FIG. 3 is a cross sectional view of the conventional DFB laser shown in FIG. 1 illustrating another production step thereof.
Figure 4:
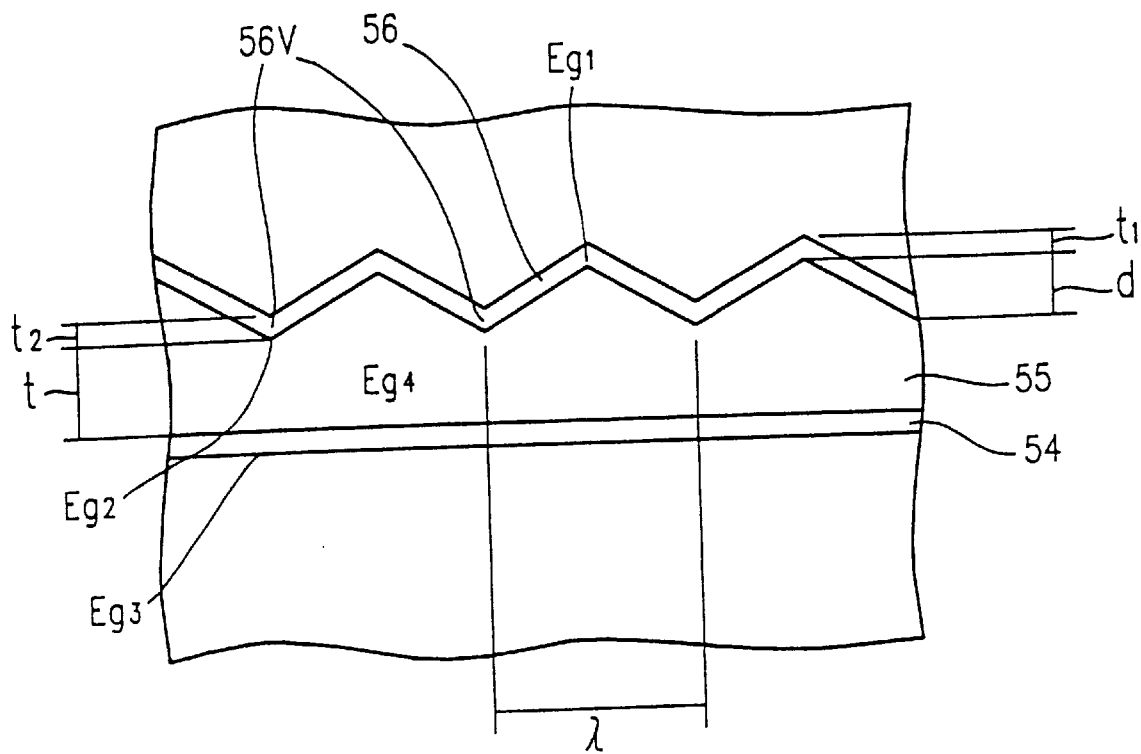
FIG. 4 is a partial cross sectional view of another conventional DFB laser having a gain-coupled diffraction grating.
Figure 5:
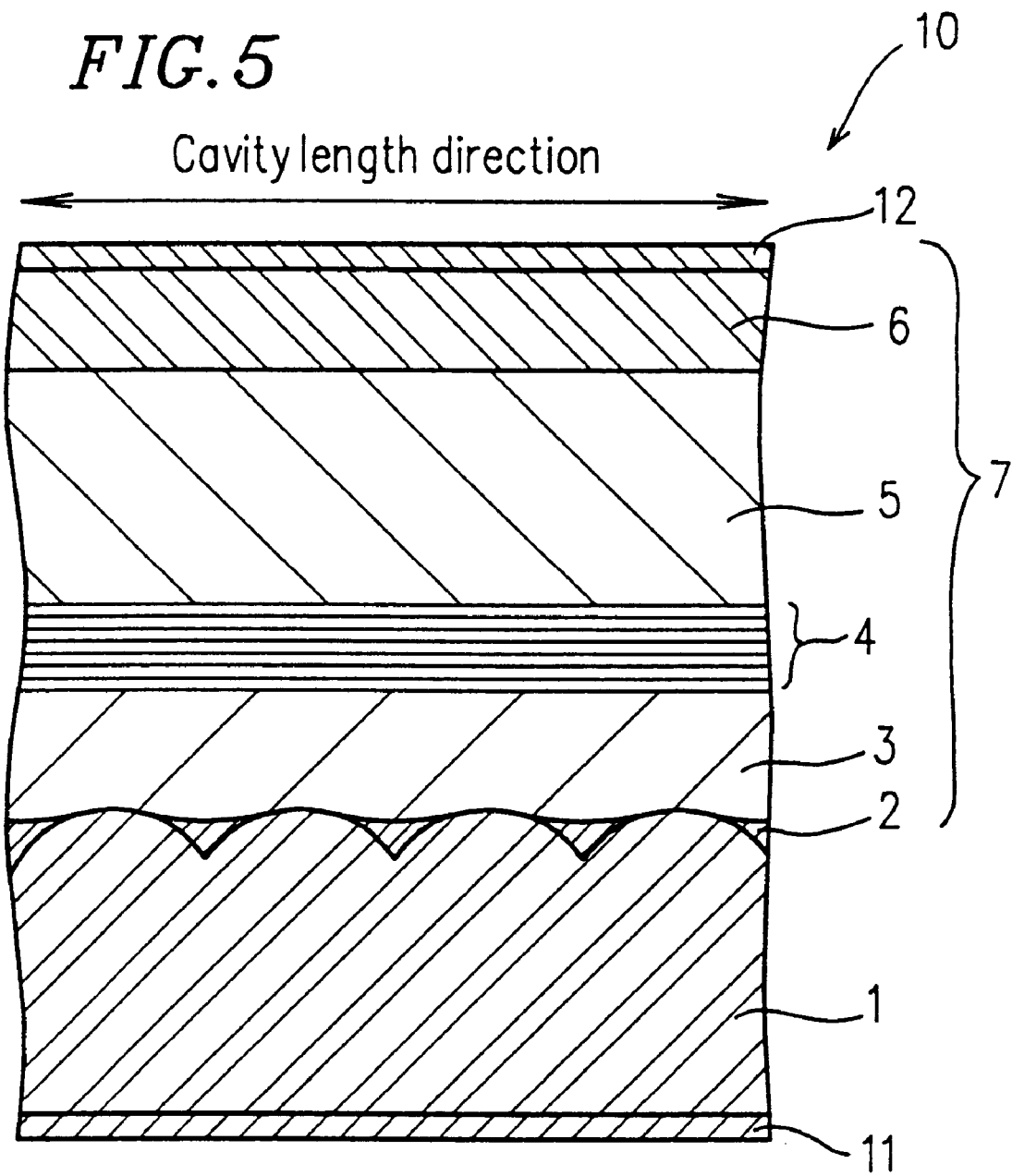
FIG. 5 is a cross sectional view of a DFB laser in a first example according to the present invention.

Referring initially to FIGS. 5 through 9C, a DFB laser in a first example according to the present invention will now be described. FIG. 5 is a cross sectional view of a DFB laser 10 in accordance with the first example.

The DFB laser 10 is formed of InP/InGaAsP materials suitable for a light source for optical communication.

As is shown in FIG. 5, the DFB laser 10 includes an n-InP substrate 1 (n=1·10$^{18}$ cm$^{-3}$) and a semiconductor multi-layer structure 7 provided on the n-InP substrate 1. A gain-coupled diffraction grating is provided between the n-InP substrate 1 and the semiconductor multi-layer structure 7.

The semiconductor multi-layer structure 7 includes an n-InGaAsP optical waveguide layer 3 (n=1·10$^{18}$ cm$^{-3}$; thickness: 100 nm) having a band gap wavelength $\lambda$g=1.05 $\mu$m, an undoped InGaAsP strained MQW active layer 4, a p-InP cladding layer 5 (p=1·10$^{18}$ cm$^{-3}$), and a p-InGaAs contact layer 6 (p=5·10$^{18}$ cm$^{-3}$; thickness: 0.5 $\mu$m). The InGaAsP strained MQW active layer 4 includes ten InGaAsP barrier layers (thickness: 10 nm) having $\lambda$g=1.05 $\mu$m and ten InGaAsP well layers (thickness: 6 nm; non-alignment ratio of the grating: +0.7%) having $\lambda$g=1.40 $\mu$m laminated alternately. The gain peak wavelength of the InGaAsP strained MQW active layer 4 is 1.31 $\mu$m.

On a surface of the n-InP substrate 1 which does not have the diffraction grating, an n-type electrode 11 is provided. On the p-InGaAs contact layer 6, a p-type electrode 12 is provided. An electric current flows between the electrodes 11 and 12.

In order to allow the lateral mode to be single, the active layer 4 is provided in a stripe having a width of, for example, 1.2 $\mu$m and extended in a direction of a cavity length. Each stripe of the active layer 4 is sandwiched by a current block layer (not shown) formed of a p-InP layer and an n-InP layer. The current block layer confines the current flowing between the electrodes 11 and 12, thereby effectively injecting the current into the stripe-shaped active layer 4.

The gain-coupled diffraction grating has a plurality of curved projections formed periodically at a top surface of the n-InP substrate 1 (one period or pitch: 200.7 nm) and a continuous quantum well light absorption layer 2 covering the curved projections. Any two adjacent curved projections are bordered by a groove having a sharp-edged bottom. The level of a top of the curved projections and the level of the bottom of the grooves are approximately 50 nm apart.

The quantum well light absorption layer 2 is formed of n-InGaAs (n=1·10$^{18}$ cm$^{-3}$) and has a band gap wavelength $\lambda$g of 1.68 $\mu$m. The thickness of the quantum well light absorption layer 2 changes periodically and nonlinearly along the cavity, and is 30 nm at the maximum and several nanometers or less at the minimum. The thickest areas of the quantum well light absorption layer 2 correspond to the bottom of the grooves and the thinnest areas correspond to the top of the curved projections.

The band gap of the quantum well light absorption layer 2 changes in accordance with the thickness thereof due to an quantum effect. Accordingly, the band gap of the quantum well light absorption layer 2 also changes periodically and nonlinearly along the cavity. In the DFB laser 10 in this example, the thickest areas each have a band gap adjusted so as to allow the thickest areas to absorb the laser light, and the thinnest areas each have a band gap adjusted so as to prevent the thinnest areas from absorbing the laser light. In this manner, the grooves between the curved projections act as the light absorbing areas and the top areas of the curved projections act as the non-light absorbing areas, which are thinner than the light absorption areas. Thus, the optical gain-coupled diffraction grating functions.

Figure 6A:
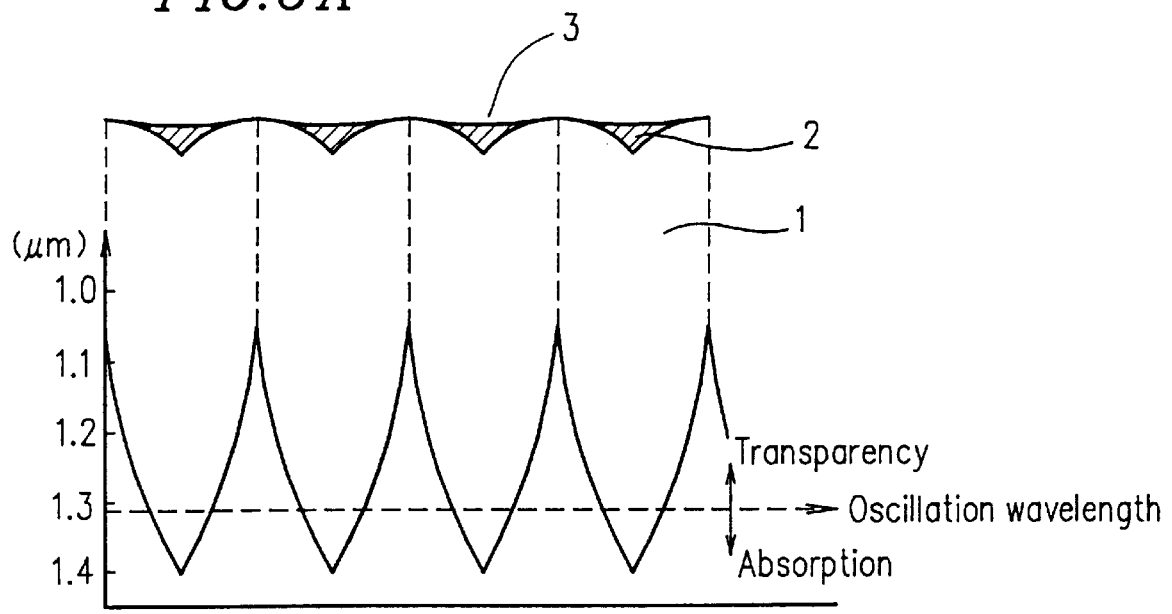
FIG. 6A is a diagram illustrating a wavelength at a light absorption end in positional relation with the a quantum well light absorption layer of the DFB laser shown in FIG. 5.
Figure 6B:
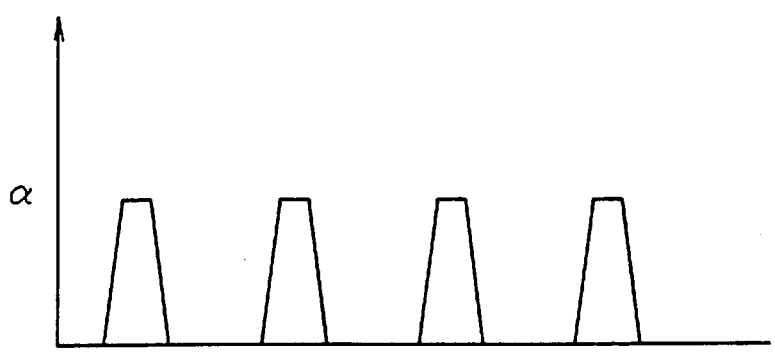
FIG. 6B is a graph illustrating the distribution of the absorption ratio α with respect to the quantum well light absorption layer of the DFB laser shown in FIG. 5.

FIG. 6A is a diagram schematically showing the wavelength $\lambda$ a at the light absorption edge (namely, the wavelength at which the light absorption ratio is zero) of the quantum well light absorption layer 6 having the thickness changing periodically. FIG. 6B is a graph showing the distribution of the light absorption ratio $\alpha$ of the quantum well light absorption layer 2 in positional relation therewith. The quantum well light absorption layer 2 has a two-dimensional quantum well structure, and the band gap thereof drastically changes in accordance with the thickness thereof. Consequently, the wavelength $\lambda$ a at the light absorption edge of the quantum well light absorption layer 2 also changes periodically.

As is illustrated in FIG. 6A, the wavelength $\lambda$ a of the light absorption edge of the thickest areas of the quantum well light absorption layer 2 is 1.4 $\mu$m while that of the thinnest areas is 1.05 $\mu$m. Such a large difference in the wavelength at the light absorption edge is obtained by thus utilizing the quantum well effects. In the case that the oscillation wavelength of the DFB laser 10 is 1.31 $\mu$m, the laser light is absorbed by only an area of the quantum well light absorption layer 2 which has the wavelength $\lambda$ a of 1.31 $\mu$m or more. Such an area acts as a light absorption area, and the rest is transparent with respect to the laser light and thus acts as a non-light absorption area. Since the light absorption ratio of the quantum well light absorption layer 2 changes periodically along the cavity, the gain with respect to the laser light also changes periodically. As a result, laser light having a specific wavelength corresponding to the period of the diffraction grating is obtained, thereby realizing the single longitudinal mode oscillation.

The light absorption ratio is preferably distributed as a delta function by the rapid change of the band gap of the quantum well light absorption layer 2 as is illustrated in FIG. 6B. In the quantum well light absorption layer 2 of the DFB laser 10 in this example, the gain-coupled diffraction grating having a duty ratio of approximately 0.2 or less is obtained at a high yield. Such a diffraction grating has a low loss and a high gain coupling coefficient.

Although the quantum well light absorption layer 2 is formed of n-InGaAs in this example, p-InGaAs or InGaAsP may also be used. The optical waveguide layer 3 may be replaced with an n-InP cladding layer.

Figure 7A:
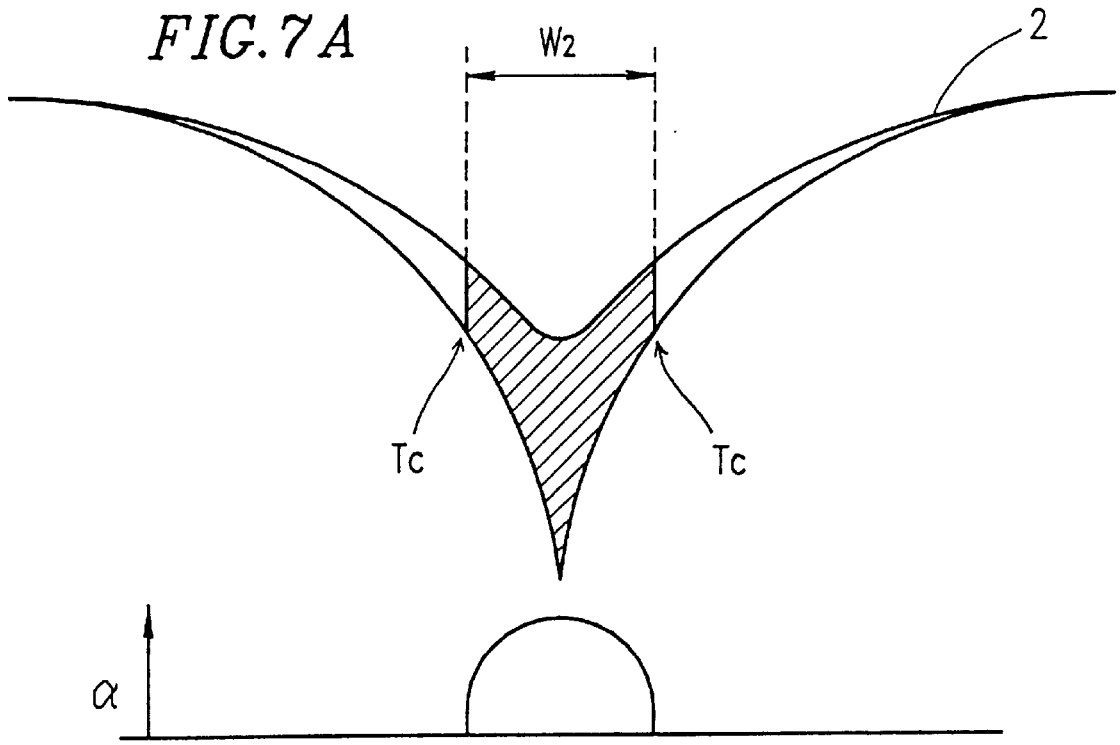
FIG. 7A is a detailed cross sectional view of a gain-coupled diffraction grating of the DFB laser shown in FIG. 5.
Figure 7B:
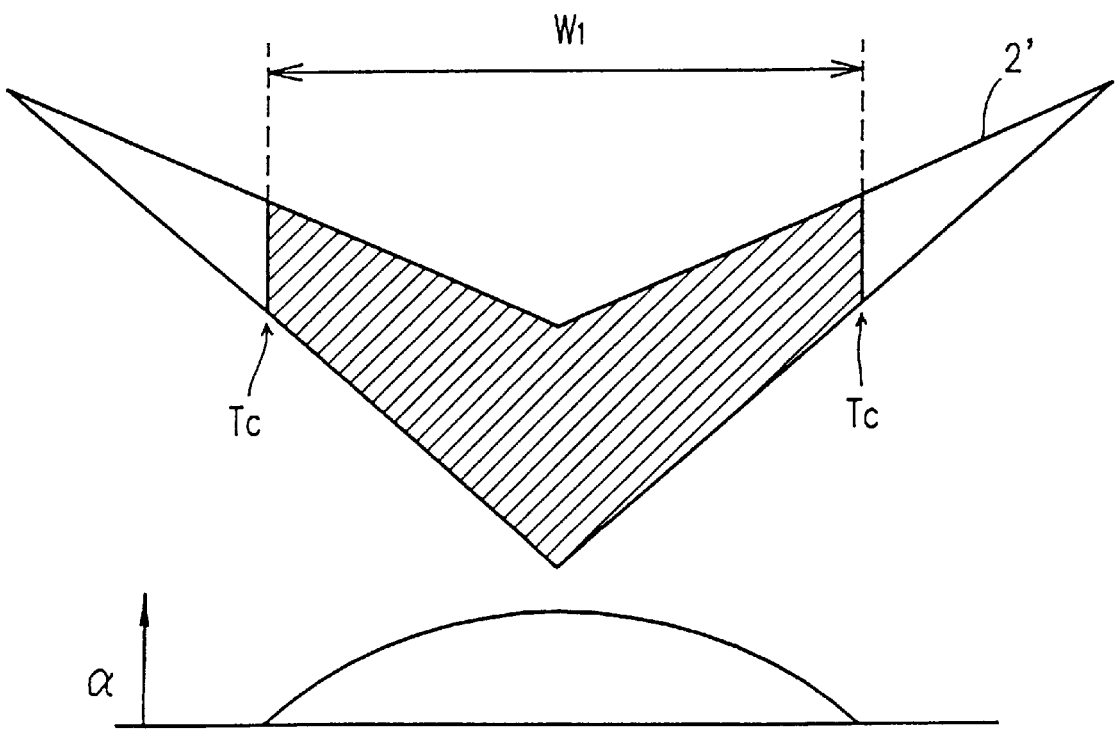
FIG. 7B is a detailed cross sectional view of a gain-coupled diffraction grating of another DFB laser.

Referring to FIGS. 7A and 7B, the relationship between the shape of the surface on which the quantum well light absorption layer 2' is formed and the duty ratio is shown. The duty ratio is, as mentioned above, the ratio of the size of the light absorption area along the cavity with respect to the pitch or one period of the diffraction grating (200.7 nm).

FIG. 7A is a diagram illustrating the distribution of the light absorption ratio $\alpha$ of the quantum well light absorption layer 2 of the DFB laser 10 shown in FIG. 5 with positional relation with the cross section thereof. FIG. 7B is a diagram illustrating the distribution of the light absorption ratio $\alpha$ of a quantum well light absorption layer 2' of another DFB laser with positional relation with the cross section thereof. As is shown in FIG. 7A, the projections formed at the surface of the substrate 1 of the DFB laser 10 are curved. Such a shape of the projections has the following advantages over the sawtooth-shaped projections shown in FIG. 7B.

The two shapes of the projections will be compared with the assumption that the quantum well light absorption layers 2 and 2' have a thickness of, for example, 30 nm at the thickest areas in both structures.

In the structure of FIG. 7B, an area Tc having a threshold thickness for separating the light absorption area from the non-light absorption area is relatively far from the bottom of the groove. That is to say that the duty ratio (W1/Pitch) is relatively high. A high duty ratio wholly increases the light absorption ratio of the laser light, thereby reducing the quantum efficiency and increasing the current at the oscillation threshold level. Further, in the case of FIG. 7B, the thickness of the quantum well light absorption layer 2' changes linearly and slowly along the cavity. This indicates that the light absorption ratio α changes slowly.

In the structure of FIG. 7A, the area Tc is relatively close to the bottom of the groove. Accordingly, a small duty ratio (W2/Pitch: for example, 0.2 or less) is obtained with no necessity of forming a microscopic pattern for the diffraction grating by etching. Further, the thickness of the quantum well light absorption layer 2 changes non-linearly and rapidly along the cavity. This indicates that the light absorption ratio α changes rapidly.

In the production of the structure shown in FIG. 7B, the following problems occur if the process parameters change.

Figure 8A:
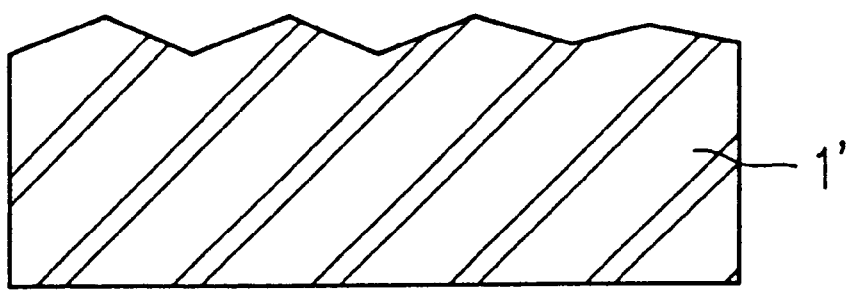
FIGS. 8A and 8B are partial cross sectional views of the DFB laser shown in FIG. 7B.
Figure 8B:
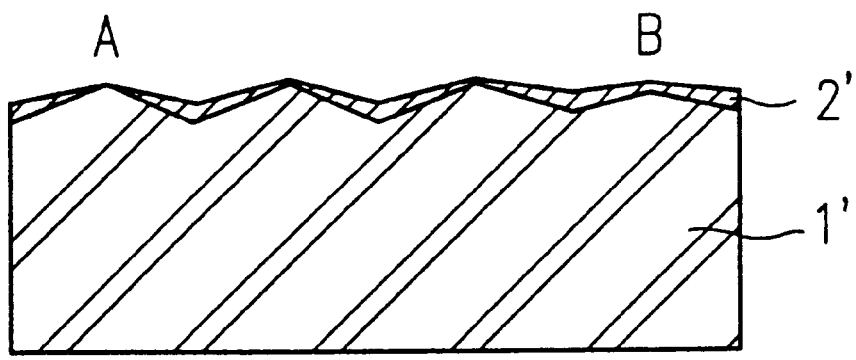
Figure 8C:
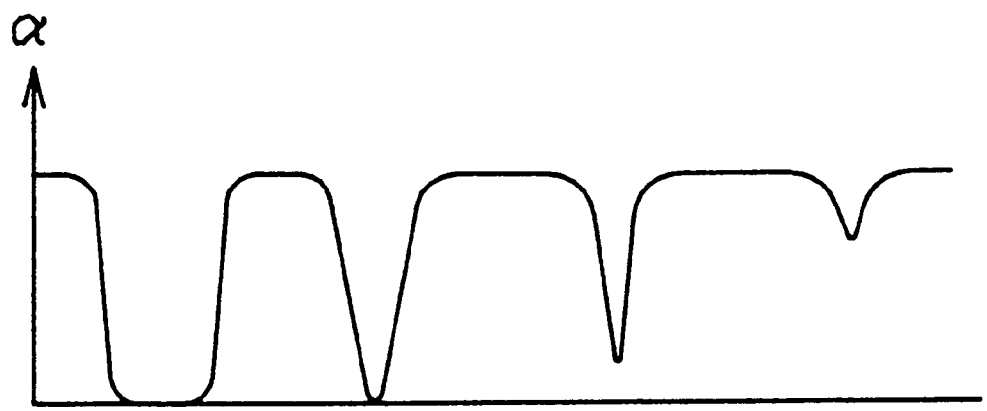
FIG. 8C is a graph illustrating the distribution of the absorption ratio of the DFB laser shown in FIG. 7B.

FIG. 8A is a cross sectional view of the substrate 1', in which the projections formed at the surface thereof have non-uniform heights due to a change in the process parameters. FIG. 8B is a cross sectional view of the substrate 1' shown in FIG. 8A and the quantum well light absorption layer 2' formed on the substrate 1'. As is illustrated in FIG. 8B, the thickness of the quantum well light absorption layer 2' changes irregularly and slowly. The quantum well light absorption layer 2' is too thin to absorb the laser light in area A, but is sufficiently thick to absorb the laser light in area B. FIG. 8C is a graph illustrating the distribution of the light absorption ratio α of the quantum well light absorption layer 2' with positional relation therewith. In the structure of FIG. 8B, since the thickness of the quantum well light absorption layer 2' changes relatively slowly along the cavity, it is difficult to make the thickness too thin to absorb the laser light. As a result, the diffraction grating easily becomes defective depending on the shape of the projections of the substrate 1'.

In the case of the structure shown in FIG. 7A, the thickness of the quantum well light absorption layer 2 changes relatively rapidly. Accordingly, even if the projections at the surface of the substrate 1 are varied to some extent in shape, the light absorption ratio α cannot be distributed as is shown in FIG. 8C. As has been described, the structure of FIG. 7A has various advantages over the structure of FIG. 7B.

As is mentioned above, the quantum well light absorption layer 2 may be formed of InGaAsP. The same effects can be obtained by adjusting the composition and the thickness. The optical waveguide layer 3 may be provided on the active layer 4 (the optical waveguide layer 3 is of the p-type), in which case, the quantum. well light absorption layer 2 is sandwiched between the optical waveguide layer 3 and the p-InP cladding layer 5. The conductivity type of each of the layers including the substrate 1 may be totally opposite to the conductivity type described above.

In this example, the degree of refractive index coupling can be easily controlled by changing the composition and the thickness of the n-InGaAsP optical waveguide layer 3. As is described by Kudo et al. in 13*th IEEE International Semiconductor Laser Conference Digest*, p. 16 (1992), an effective line width broadening factor can be greatly reduced by optimizing the degree of refractive index coupling, as a result of which, the spectrum characteristics can be remarkably improved.

Figure 9A:
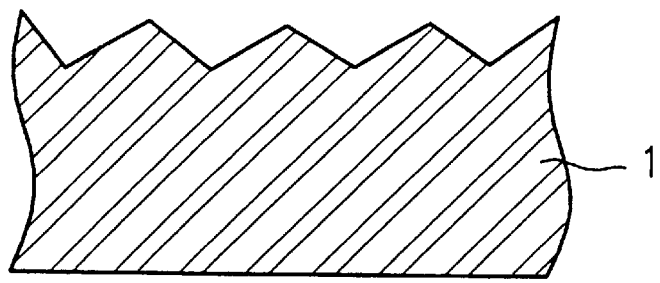
FIGS. 9A through 9C are cross sectional views of the DFB laser shown in FIG. 5 illustrating production steps thereof.
Figure 9B:
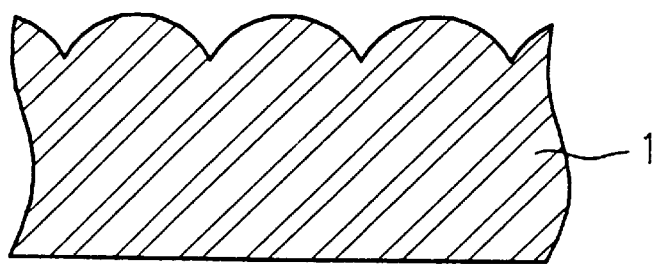
Figure 9C:
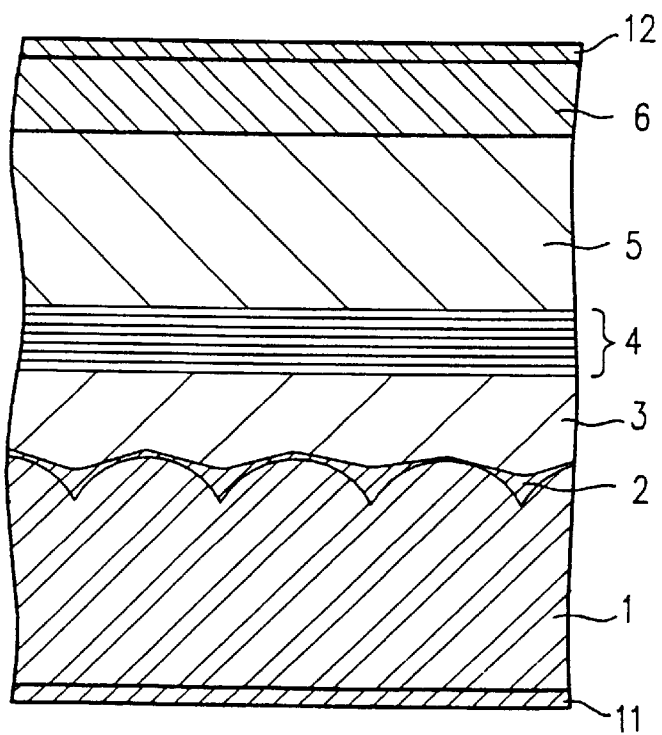

Referring to FIGS. 9A through 9C, a method for fabricating the DFB laser 10 will be described.

First, on the n-InP substrate 1, a resist layer (not shown) in a grating pattern having a pitch of 200.7 nm is formed by holographic exposure, and then the top surface of the n-InP substrate 1 is etched by a diluted solution of bromine water with over-etching (first etching or dry etching). When the resist layer is removed, sawtooth-shaped projections shown in FIG. 9A and the curved projections shown in FIG. 9B both exist at the surface of the n-InP substrate 1.

Next, the n-InP substrate 1 is immersed in a mixture solution of $H_2SO_4$, $H_2O_2$, and $H_2O$ (mixture ratio: 5:1:1) for three minutes (second etching or wet etching). As a result of the second etching, all the sawtooth-shaped projections are curved as is shown in FIG. 9B. As a consequence, a plurality of curved projections are arranged along the cavity with a high uniformity in shape.

Next, on the n-InP substrate 1, the Si-doped n-InGaAs quantum well light absorption layer 2 ($n=1 \cdot 10^{18}$ cm$^{-3}$) having the band gap wavelength λg=1.68 μm, the Si-doped n-InGaAsP optical waveguide layer 3 ($n=1 \cdot 10^{18}$ cm$^{-3}$; thickness: 100 nm) having the band gap wavelength λg=1.05 μm, the undoped InGaAsP strained MQW active layer 4, the p-InP cladding layer 5 ($p=1 \cdot 10^{18}$ cm$^{-3}$), and the p-InGaAs contact layer 6 ($p=5 \cdot 10^{18}$ cm$^{-3}$; thickness: 0.5 μm) are grown by MOVPE (metal organic vapor phase epitaxy). The InGaAsP strained MQW active layer 4 is formed by alternately laminating ten InGaAsP barrier layers (thickness: 10 nm) having λg=1.05 μm and ten InGaAsP well layers (thickness: 6 nm; non-alignment ratio of the grating: +0.7%) having λg=1.40 μm.

After that, the n-type electrode 11 is formed on the surface of the n-InP substrate 1 which does not have the quantum well light absorption layer 2, and the p-type electrode 12 is formed on the p-InGaAs contact layer 6. In this manner, the DFB laser having a cavity structure is produced as is shown in FIG. 9C. Before formation of the electrodes 11 and 12, other processing such as mesa etching or formation of a current confinement structure may be performed if necessary.

In the above-described method, etching is performed in two steps: the first or dry etching and the second or wet etching. Due to the curved projections substantially completely shaped by the second etching, the light absorption areas of the quantum well light absorption layer 2 having a high light absorption ratio are selectively formed at the grooves. Even if the vicinity of the surface of the substrate 1 is damaged by the first (dry) etching, the damaged area can be removed by the second, wet etching. Thus, a highly reliable DFB laser can be produced.

Further according to the method in this example, the absorptive diffraction grating is formed by etching the surface of the substrate 1. Such a step protects the quantum well light absorption layer 2 and the optical waveguide layer 3 from deformation and disappearance against etching, and thus reduces dispersion of the gain-coupling coefficient and the refractive index coupling coefficient.

EXAMPLE 2

Figure 10:
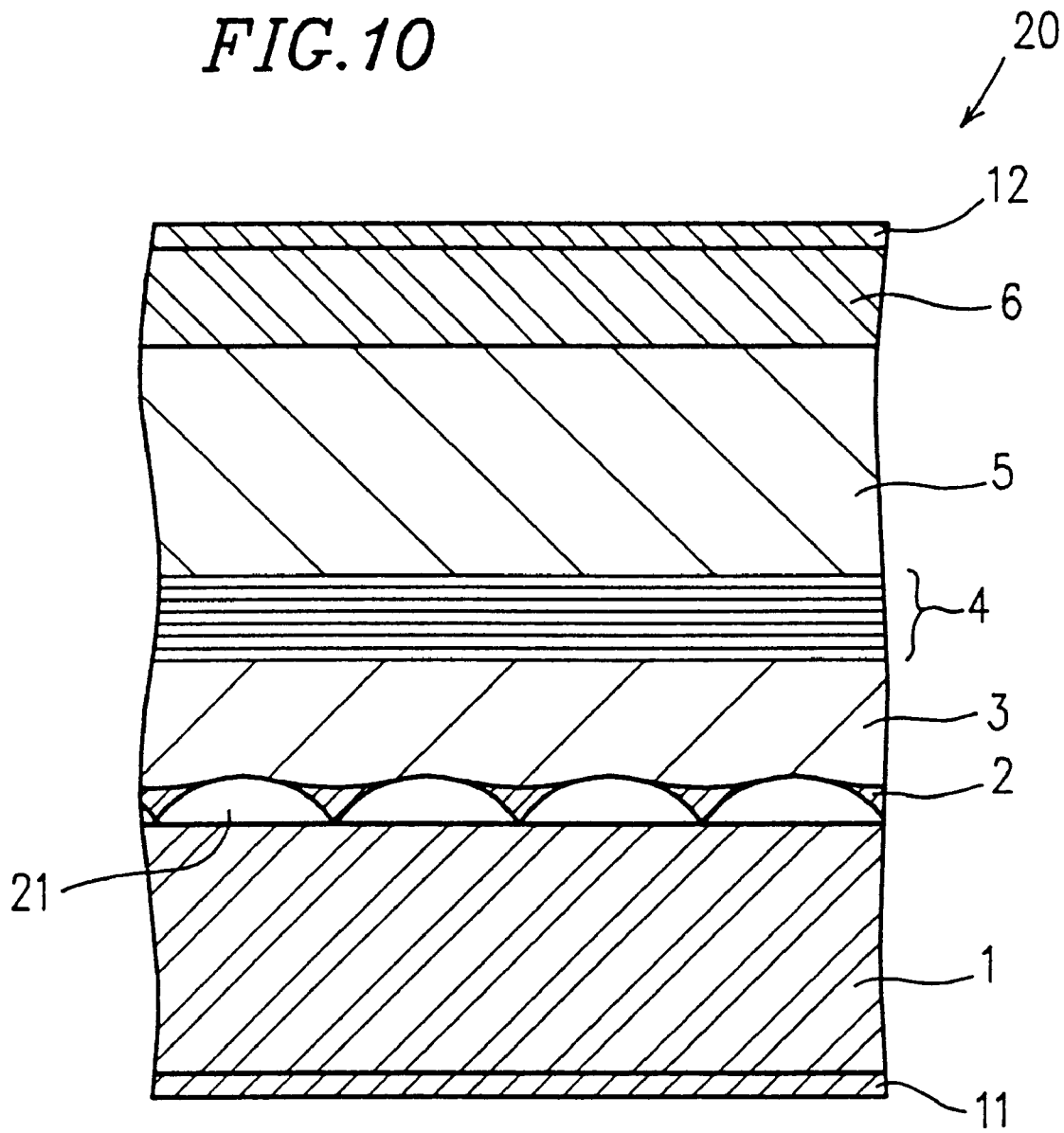
FIG. 10 is a cross sectional view of a DFB laser in a second example according to the present invention.

Referring to FIGS. 10 and 11A through 11C, a DFB laser 20 in a second example according to the present invention will be described. FIG. 10 is a cross sectional view of a DFB laser 20 in accordance with the second example. Identical elements as those in the first example bear identical reference numerals therewith.

The DFB laser 20 includes an n-InGaAsP optical waveguide layer 21 (for example, $\lambda$g=1.10 $\mu$m; thickness: 40 nm) between the n-InP substrate 1 and the n-InGaAs quantum well light absorption layer 2, and the diffraction grating is formed at a top surface of the n-InGaAsP optical waveguide layer 21. Although the diffraction grating includes curved projections in FIG. 10, the diffraction grating may include sawtooth-shaped projections. The DFB laser 20 has the same structure as the DFB laser 10 except for the above-mentioned points.

The optical waveguide layer 21 has a narrower band gap than that of the optical waveguide layer 3, and so has a higher refractive index than that of the optical waveguide layer 3. As is illustrated in FIG. 10, the thickness of the optical waveguide layer 21 changes periodically along the cavity. The period of such a change corresponds to the period of the change in the thickness of the quantum well light absorption layer 2 along the cavity, but is offset in phase by 180°.

The periodical change in the effective refractive index with respect to the laser light can be compensated for by adjusting the thickness and the composition of the two optical waveguide layers 21 and 3. By compensating for such a periodical change, the refractive index coupling can be ignored, and thus purer gain coupling is realized. If the refractive index coupling cannot be ignored, the problem of a refractive index-coupled laser, namely, the undesirable phase fluctuation due to the axial hole burning possibly occurs. In the DFB laser 20 in this example, a semiconductor layer for compensating for the periodical change of the refractive index is provided on the substrate 1. Such a structure greatly restricts the refractive index coupling, and thus remarkably prohibits the phase unstability of the oscillation mode caused by the dispersion of the phase fluctuation at the end surface and the axial hole burning. As a consequence, the single mode oscillation is obtained at a high yield at a high output, and moreover chirp is low.

The diffraction grating is not formed directly at the surface of the n-InP substrate 1, but at a surface of the n-InGaAsP optical waveguide layer 21 which is more stable than the substrate 1 against heating. Accordingly, the diffraction grating can be protected from deformation during heating which is performed in the process for growing the quantum well light absorption layer 2, and thus dispersion of the shape of the diffraction grating is restricted.

Figure 11A:
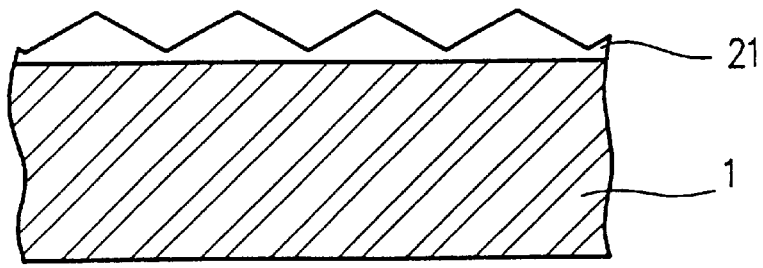
FIGS. 11A through 11C are cross sectional views of the DFB laser shown in FIG. 10 illustrating production steps thereof.
Figure 11B:
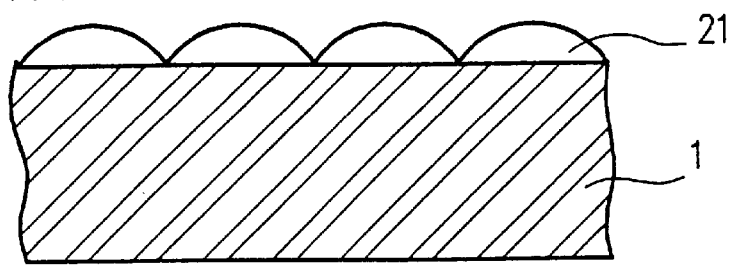
Figure 11C:
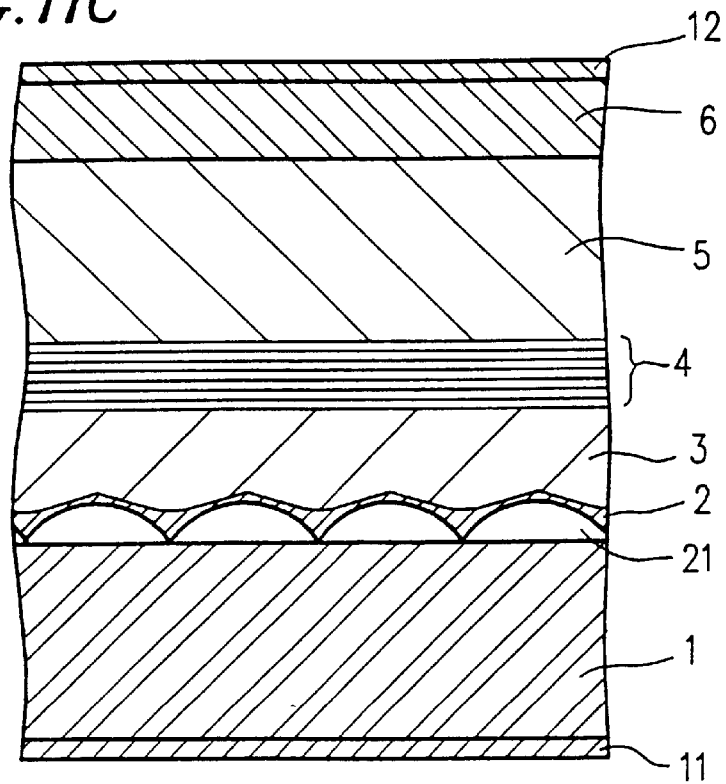

With reference to FIGS. 11A through 11C, a method for fabricating the DFB laser 20 will be described.

First, on the n-InP substrate 1, the Si-doped n-InGaAsP optical waveguide layer 21 (n=1·10$^{18}$ cm$^{-3}$; thickness: 40 nm) having $\lambda$g=1.10 $\mu$m is formed by MOVPE. Next, a resist layer (not shown) in a grating pattern having a pitch of 200.7 nm is formed by holographic exposure, and then the top surface of the n-InGaAsP optical waveguide layer 21 is etched by a diluted solution of bromine water with over-etching (first etching or dry etching). When the resist layer is removed, sawtooth-shaped projections shown in FIG. 11A and the curved projections shown in FIG. 11B both exist at the surface of the n-InGaAsP optical waveguide layer 21.

Next, the n-InGaAsP optical waveguide layer 21 is immersed in a mixture solution of $H_2SO_4$, $H_2O_2$, and $H_2O$ (mixture ratio: 1:1:50) for three minutes (second etching or wet etching). As a result of the second etching, all the sawtooth-shaped projections are curved as is shown in FIG. 11B. As a consequence, a plurality of curved projections are arranged along the cavity with a high uniformity.

Next, the depth of the diffraction grating is measured by ellipsometry, a diffraction efficiency measurement method, or the like. After that, on the optical waveguide layer 21, the Si-doped n-InGaAs quantum well light absorption layer 2 (n=1·10$^{18}$ cm$^{-3}$) having a band gap wavelength $\lambda$g=1.68 $\mu$m, the Si-doped n-InGaAsP optical waveguide layer 3 (n=1·10$^{18}$ cm$^{-3}$; thickness: 100 nm) having a band gap wavelength $\lambda$g=0.92 to 1.1 $\mu$m, the undoped InGaAsP strained MQW active layer 4, the p-InP cladding layer 5 (p=1·10$^{18}$ cm$^{-3}$), and the p-InGaAs contact layer 6 (p=5·10$^{18}$ cm$^{-3}$; thickness: 0.5 $\mu$m) are grown by MOVPE. The composition of the optical waveguide layer 3 is determined by the depth of the diffraction grating. The InGaAsP strained MQW active layer 4 is formed by alternately laminating ten InGaAsP barrier layers (thickness: 10 nm) having the same composition with that of the optical waveguide layer 3 and ten InGaAsP well layers (thickness: 6 nm; non-alignment ratio of the grating: +0.7%) having $\lambda$g=1.40 $\mu$m.

After that, the n-type electrode 11 is formed on a surface of the n-InP substrate 1 which does not have the optical waveguide layer 21, and the p-type electrode 12 is formed on the p-InGaAs contact layer 6. In this manner, the DFB laser 20 having a cavity structure is produced as is shown in FIG. 11C. Before formation of the electrodes 11 and 12, other processing such as mesa etching or formation of a current confinement structure may be performed if necessary.

In the above-described method, the projections are formed at a high uniformity in shape in the wafer. In addition, the composition of the optical waveguide layer 3 can be adjusted after examining the shape of the projections at the surface of the optical waveguide layer 21. Such a step allows for compensation for the periodical change of the refractive index at a higher precision. The adjustment of the refractive index may be performed based on the thickness of the optical waveguide layer 21 instead of the composition thereof.

EXAMPLE 3

Figure 12A:
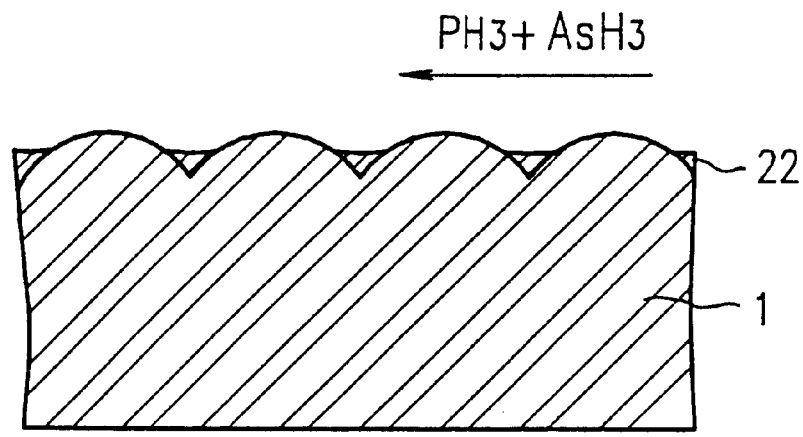
FIGS. 12A and 12B are cross sectional views of a DFB laser in a third example according to the present invention illustrating production steps thereof.
Figure 12B:
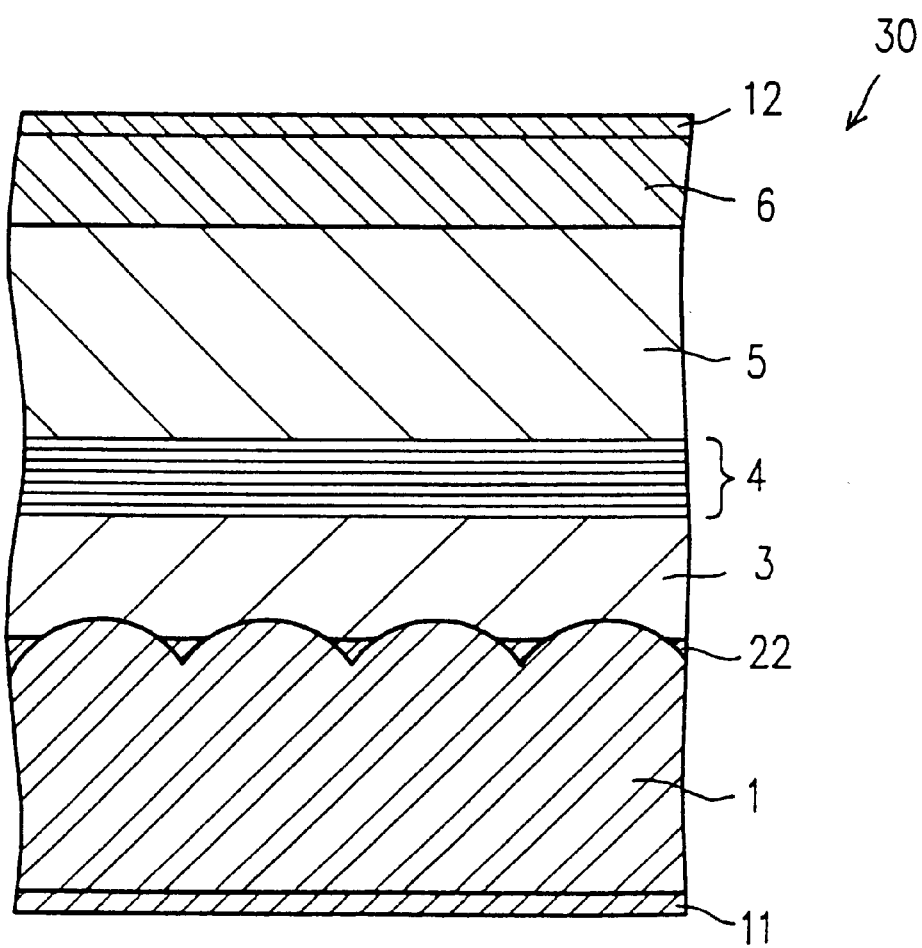

Referring to FIGS. 12A and 12B, a DFB laser 30 in a third example according to the present invention will be described together with a method for fabricating the same. FIG. 12A is a cross sectional view of a substrate 1 of a DFB laser 30 in accordance with the second example, and FIG. 12B is a cross sectional view of the DFB laser 30. Identical elements as those in the first example bear identical reference numerals therewith.

For fabricating the DFB laser 30, first, a top surface of the n-InP substrate 1 is etched into the shape as shown in FIG. 12A in the manner described in the first and the second examples. Then, the substrate 1 is put into an MOVPE apparatus, and is heated at a temperature of 600° C. for approximately ten minutes in a mixture gas (pressure: 60 Torr) of $PH_3$ (200 sccm) and $AsH_3$ (100 sccm), the mixture gas being diluted to 10% by hydrogen.

As a result of the heating, an InAsP quantum well light absorption layer 22 is grown selectively only in each of the grooves between the projections. Such growth occurs in the following manner. During the heating, phosphorus (P) is isolated from the projections, thereby leaving indium (In) behind. Then, indium atoms are diffused over the surface of the substrate 1 to reach the grooves, and are bonded with arsenide (A) atoms and phosphorus atoms from the gas phase.

Next, still in the MOVPE apparatus, an n-InP cladding layer 3 (n=1·10$^{18}$ cm$^{-3}$; thickness: 100 nm), the undoped InGaAsP strained MQW active layer 4, the p-InP cladding layer 5 (p=1·10$^{18}$ cm$^{-3}$), and the p-InGaAs contact layer 6 (p=5·10$^{18}$ cm$^{-3}$; thickness: 0.5 μm) are grown. The InGaAsP strained MQW active layer 4 is formed by alternately laminating ten InGaAsP barrier layers (thickness: 10 nm) and ten InGaAsP well layers (thickness: 6 nm; non-alignment ratio of the grating: +0.7%).

After that, the n-type electrode 11 is formed on a surface of the n-InP substrate 1 which does not have the InAsP quantum well light absorption layer 22, and the p-type electrode 12 is formed on the p-InGaAs contact layer 6. In this manner, the DFB laser 30 having a cavity structure is produced as is shown in FIG. 12B.

The band gap of the InAsP quantum well light absorption layer 22 is adjusted by the flow ratio of the PH$_3$ gas and the AsH$_3$ gas. When the flow ratio changes, the ratio of As with respect to the InAsP quantum well light absorption layer 22 changes. If such a ratio of As is too low, the light absorbing function of the layer 22 is deteriorated. Accordingly, the InAsP quantum well light absorption layer 22 preferably includes As at a relatively high mole fraction. For example, in the case that the flow ratio of PH$_3$:AsH$_3$=10:1, the InAsP quantum well light absorption layer 22 has a band gap adjusted so as to allow the layer 22 to strongly absorb laser light having a wavelength of 1.3 μm.

One serious problem in the etching process for forming the projections and grooves is dispersion or fluctuation of the shape of the projections. There is no substantial dispersion in the shape of the grooves. In the method in this example, since the InAsP quantum well light absorption layer 22 is grown only in the grooves between the projections, the characteristics of the gain-coupled diffraction grating is not influenced by the dispersion of the shape of the projections.

Moreover, the size of the light absorption area of the InAsP quantum well light absorption layer 22 along the cavity can be 10 nm or less. Although it is extremely difficult to form the light absorption area having a size of 20 nm or less along the cavity by usual photolithography, the method in this example allows for formation of such microscopic light absorption areas uniformly.

Thus, a gain-coupled diffraction grating having a uniform and small duty ratio and a high light absorption ratio can be formed.

The projections at the surface of the substrate 1 may be sawtooth-shaped as shown in FIG. 9A. The n-InP cladding layer 3 may be formed of n-InGaAsP, in which case, the quantum well light absorption layer 22 is formed of a material including gallium (Ga).

The method in this example for growing the quantum well light absorption layer 22 is applicable for forming a diffraction grating at the surface of the active layer.

In the first through third examples, the DFB laser uses InGaAsP/InP materials for obtaining the laser light having an oscillation wavelength of 1.3 μm. The present invention is also applicable to a DFB laser formed of AlGaAs/GaAs or other materials for obtaining laser light having other ranges of oscillation wavelengths.

EXAMPLE 4

Figure 13A:
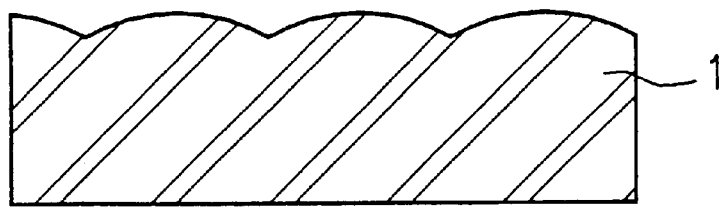
FIG. 13A through 13C are cross sectional views of a DFB laser in a fourth example according to the present invention illustrating production steps thereof.
Figure 13B:
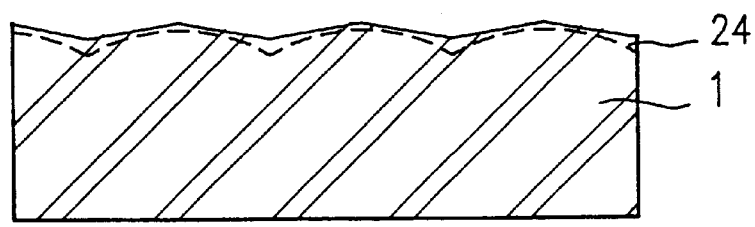
Figure 13C:
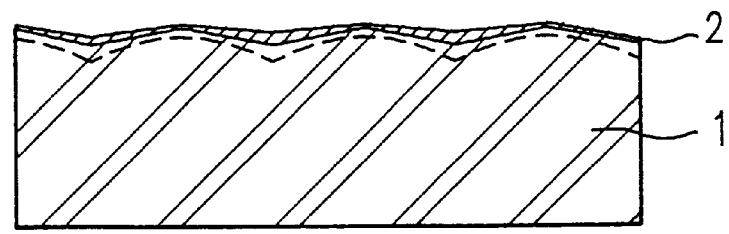

Referring to FIGS. 13A through 13C, a method for fabricating a DFB laser in a fourth example according to the present invention will be described. The DFB laser has a different shape of diffraction grating from that of the DFB laser 10 of FIG. 5. The duty ratio of the DFB laser is higher than that of the DFB laser 10.

On the n-InP substrate 1, a resist layer (not shown) in a grating pattern having a pitch of 200.7 nm is formed, and then a top surface of the n-InP substrate 1 is etched by a diluted solution of bromine water with over-etching. When the resist layer is removed, surved projections shown in FIG. 13A and sawtooth-shaped projections (not shown) both exist at the surface of the n-InP substrate 1. After that, the depth of the grooves between the projections is measured by ellipsometry, a diffraction efficiency measurement method, or the like.

Next, as is shown in FIG. 13B, an n-InP layer 24 having a thickness of several tens of nanometers is grown on the projections. The thickness of the n-InP layer 24 is determined based on the depth of the grooves measured above. Where the groove is relatively deep, the InP layer 24 is formed to be relatively thick. In this manner, the dispersion of the shape of the projections and grooves is compensated for. Since the n-InP layer 24 has a sawtooth shape as is shown in FIG. 9A to cover the curved projections shown in FIG. 13A, the diffraction grating can be uniformized in shape even if the shape is dispersed by etching.

Figure 13D:
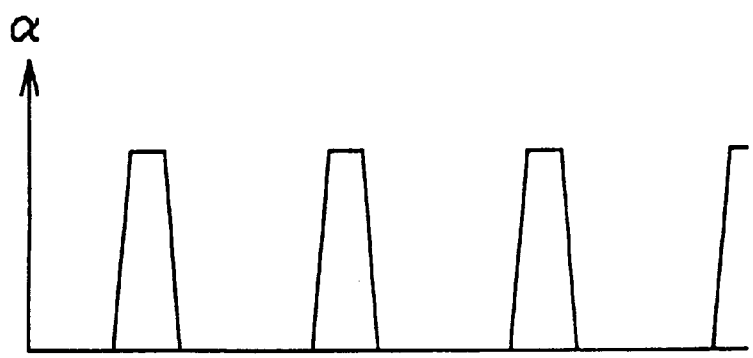
FIG. 13D a graph illustrating the distribution of the absorption ratio of the DFB laser shown in FIGS. 13A through 13C.

Next, as is shown in FIG. 13C, the InGaAs quantum well light absorption layer 2 is grown on the n-InP layer 24. The InGaAs quantum well light absorption layer 2 has a thickness of 30 nm at the grooves and is discontinued at the top of the projections. FIG. 13D is a graph illustrating the distribution of the light absorption ratio of the diffraction grating in positional relation therewith. Because of the uniform shape of the diffraction grating in the whole cavity, the light absorption ratio is distributed uniformly.

As has been described so far, in a DFB laser according to the present invention, the characteristics of the gain-coupled diffraction grating are stably maintained even if the process parameters unstably fluctuate. Accordingly, stable laser osculation is not disturbed by dispersion in the phase fluctuation at the end surface of the cavity, axial hole burning, returning laser light or the like, and thus laser light oscillating stably in a single longitudinal mode can be generated.

In a method for fabricating a DFB laser according to the present invention, a DFB laser oscillating stably in a single longitudinal mode can be produced at a high yield due to the uniform characteristics of the gain-coupled diffraction grating.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a distributed feedback semiconductor laser comprising an active layer for generating laser light and a gain-coupled diffraction grating, wherein the step of forming the diffraction grating includes the steps of:

forming a plurality of projections and grooves periodically arranged on a surface of a first semiconductor layer formed on a surface of a semiconductor substrate; and heating the projections and grooves in a gas atmosphere of a heat treatment apparatus, the gas atmosphere including Arsenic (As) to selectively grow a light absorption layer only in the grooves of the plurality of projections and grooves, the light absorption layer being formed of a material including InAsP as a main component.

2. A method for fabricating a distributed feedback semiconductor laser, comprising the steps of:

forming a gain-coupled diffraction grating on a semiconductor substrate; and forming a semiconductor multi-layer structure including an active layer for generating laser light on the diffraction grating, wherein the step of forming the diffraction grating includes the steps of:

forming a plurality of curved projections periodically arranged at a surface at a surface of the semiconductor substrate by lithography and etching; and covering the plurality of curved projections with a light absorption layer including a light absorption area having a first thickness at each border between two adjacent curved projections and a non-light absorption area having a second thickness which is smaller than the first thickness at a top of each of the curved surfaces, the light absorption area being formed to have a band gap which is narrower than a band gap of the active layer and the non-light absorption area being formed to have a band gap which is wider than the band gap of the active layer.

3. A method for fabricating a distributed feedback semiconductor laser according to claim 2, wherein the light absorption layer includes InAsP.

4. A method for fabricating a distributed feedback semiconductor laser according to claim 2, wherein the step of forming the plurality of curved projections includes the steps of:

forming sharp-edged projections and grooves periodically arranged at the surface of the semiconductor substrate by a first etching process; and curving the sharp edges of the projections by a second etching process.

5. A method for fabricating a distributed feedback semiconductor laser, comprising the steps of:

forming a gain-coupled diffraction grating on a semiconductor substrate; and forming a semiconductor multi-layer structure including an active layer for generating laser light on the diffraction grating, wherein the step of forming the diffraction grating includes the steps of:

depositing a first semiconductor layer on the semiconductor substrate;

forming a plurality of projections and grooves periodically arranged at a surface of the first semiconductor layer by lithography and etching;

covering the plurality of projections and grooves with a light absorption layer including a light absorption area having a first thickness at each of the grooves between two adjacent projections and a non-light absorption area having a second thickness which is smaller than the first thickness at a peak of each of the projections, the light absorption area being formed to have a band gap which is narrower than a band gap of the active layer and the non-light absorption area being formed to have a band gap which is wider than the band gap of the active layer; and depositing a second semiconductor layer on the light absorption layer so as to have a band gap which is wider than a band gap of the first semiconductor layer.

6. A method for fabricating a distributed feedback semiconductor laser, comprising the steps of:

forming a gain-coupled diffraction grating on a semiconductor substrate; and forming a semiconductor multi-layer structure including an active layer for generating laser light on the diffraction grating, wherein the step of forming the diffraction grating includes the steps of:

forming a plurality of projections and grooves periodically arranged by lithography and etching on a surface of the semiconductor multilayer structure formed on a surface of the semiconductor substrate; and heating the projections and grooves with a gas phase atmosphere of a heat treatment apparatus, the gas atmosphere including $AsH_3$ to form a light absorption layer of InAsP so that a plurality of parts of the light absorption layer are respectively located in the grooves.

7. A method for fabricating a distributed feedback semiconductor laser comprising forming an active layer for generating laser light and a gain-coupled diffraction grating on a semiconductor substrate, wherein the step of forming the diffraction grating includes the steps of:

forming a plurality of projections and grooves periodically arranged on a surface of a first semiconductor layer formed on a surface of the semiconductor substrate; and heating the projections and grooves in a gas atmosphere of a heat treatment apparatus, the gas atmosphere including Arsenic (As) to form a semiconductor layer only in the grooves of the plurality of projections and grooves, the semiconductor layer having a band gap which is narrower than a band gap of the active layer.

8. A method for fabricating a distributed feedback semiconductor laser according to claim 7, wherein the heating step includes forming the semiconductor layer of InAsP.

9. The method of claim 1, wherein the step of heating the projections and grooves is performed after the step of forming the plurality of projections and grooves.

* * * * *

UNITED STATES PATENT AND TRADE MARK OFFICE
CERTIFICATE OF CORRECTION

PATENT NO. : 5,960,257
DATED : September 28, 1999
INVENTOR(S) : Ishino et al.

It is certified that error appears in the above-identified patent and that said Letters Patent is hereby corrected as shown below:

Cover page, item [54] Title, "METHOD DISTRIBUTED FEEDBACK SEMICONDUCTOR LASER FOR FABRICATING" should read --METHOD FOR FABRICATING DISTRIBUTED FEEDBACK SEMICONDUCTOR LASER--.

Cover page, item [56] Referenced Cited, Foreign Patent Documents list the following:

--3145780 6/1991 Japan--

Column 15, line 13, delete second occurrence of "at a surface".

Signed and Sealed this

Twelfth Day of December, 2000

Attest:

Q. TODD DICKINSON

*Attesting Officer*  *Director of Patents and Trademarks*